United States Patent [19]
Payne

[11] 3,979,735
[45] Sept. 7, 1976

[54] INFORMATION STORAGE CIRCUIT
[75] Inventor: Michael Ian Payne, Somerville, N.J.
[73] Assignee: RCA Corporation, New York, N.Y.
[22] Filed: Mar. 10, 1975
[21] Appl. No.: 556,933

Related U.S. Application Data
[63] Continuation of Ser. No. 424,421, Dec. 13, 1973, abandoned.

[52] U.S. Cl. ............................ 340/173 FF; 307/291
[51] Int. Cl.² ..................... G11C 11/40; G11C 7/00
[58] Field of Search ............... 340/173 FF; 307/238, 307/291

[56] References Cited
UNITED STATES PATENTS
3,761,898   9/1973   Pao .............................. 340/173 FF OTHER PUBLICATIONS
RCA Linear Integrated Circuits, 8/70, pp. 4, 5, 9.
Moore, Storage Cell With Single Single Bit Line, IBM Technical Disclosure Bulletin, vol. 14, No. 6, 11/71 p. 1693.
Bleher et al., Accessing Circuit for Memory Cell, IBM Technical Disclosure Bulletin, vol. 14, No. 9, 2/72, pp. 2821-2822.
Moore, et al., Fast NDRO Memory Circuits for Integration, IBM Technical Disclosure Bulletin, vol. 14, No. 6, 11/71 p. 1666.
Bodendorf et al., Polarity-Hold Circuit with True and Complement Output, IBM Technical Disclosure Bulletin, vol. 14, No. 2 7/71, p. 416.
Berding, Simultaneous Read-Write Monolithic Storage Cell, IBM Technical Disclosure Bulletin, vol. 13, No. 3, 8/70, p. 620.
Wo, Flip-Flop with Subcollector Interconnections, IBM Technical Disclosure Bulletin, vol. 14, No. 6, 11/71, p. 1682.

*Primary Examiner*—Stuart N. Hecker
*Attorney, Agent, or Firm*—H. Christoffersen; Henry I. Schanzer

[57] ABSTRACT

A non-saturating binary memory cell includes a bistable circuit comprising two cross coupled transistors with an offset resistor connected to their emitters and a third transistor having its collector-to-emitter path connected between the base of one of said two cross-coupled transistors and a data line. Information present on the data line is written into the bistable circuit by passing a turn on current through a first diode in a direction to forward bias the base of said third transistor. The writing of information into the bistable circuit is selectively inhibited by means of a diode network connected to prevent the forward biasing of said third transistor.

8 Claims, 7 Drawing Figures

INFORMATION STORAGE CIRCUIT

STATEMENT

The invention herein described was made in the course of or under a contract (or subcontract thereunder, or grant) with the Department of the Navy.

This is a continuation of application Ser. No. 424,421, filed 12/13/73 and now abandoned.

This invention relates to data storage elements using transistors and to memories employing such elements.

One of the more significant characteristics of a memory is the time it takes to read information out of the memory and to write information back into the memory. The read-write time is controlled, to a great extent, by the switching speeds of the devices, e.g. transistors, forming the data storage elements of the memory and the transistors used in the circuits for selecting and setting the data storage elements. Transistors operated between the cutoff and saturation regions are relatively slow due to the turn on delay and to the accumulation of minority carriers during the saturated state of a transistor. A known arrangement for keeping a transistor out of saturation includes the connection of a clamping diode between the base and collector region as illustrated in FIG. 1A. In high speed circuits the clamping diode is preferably a Schottky-barrier diode (hereinafter abbreviated as SBD) since it has a lower forward voltage ($V_F$) drop than conventional silicon PN junction diodes and since it does not store minority carriers.

In this application the symbol used for an SBD is as shown for diode 3 in FIG. 1A, and the symbol used for an NPN transistor having an SBD connected between its base and collector is as shown in FIG. 1B.

For the same diode current, the $V_F$ of an SBD may be in the range of 0.5 to 0.6 volt versus 0.7 to 0.8 volt for the $V_F$ of a conventional silicon PN diode. When a Schottky clamped transistor (i.e., a transistor having an SBD connected across its collector-to-base region) is turned on, any excessive base drive is diverted through the SBD (since it has a lower $V_F$ than the base-to-collector junction diode of the transistor), preventing the transistor from reaching saturation. As a result, the turn-off time of the transistor is greatly reduced.

However, the minimum collector-to-emitter voltage ($V_{cemin}$) of a Schottky clamped transistor is considerably greater than the collector-to-emitter saturation voltage ($V_{ce\ SAT}$) of an unclamped transistor. For example, the $V_{cemin}$ of a Schottky clamped transistor may be 0.2 to 0.4 volt versus an unclamped $V_{ce\ SAT}$ of 0.1 to 0.3 volt. Increasing the minimum collector-to-emitter voltage of a transistor gives rise to problems best explained by referring to the memory cell of FIG. 2, whose data and address lines are coupled to either $V_{cc}$ or ground by Schottky clamped transistors.

The memory cell includes transistors T1 and T2 which are cross-coupled to form a bistable circuit and whose emitters are connected to ground. Information is written into the bistable circuit by turning on Schottky clamped transistor T3, whose collector-to-emitter path is connected between the base of transistor T1 and the data line. Transistor T3 is turned on by means of a transistor T4 having its collector connected to the base of transistor T3 and its two emitters connected to address line terminals 12 and 14. When the address signals A and B applied to terminals 12 and 14, respectively, are both high, the cell is selected. A current flows from $V_{cc}$ through resistor 26 and through the base-to-collector junction of transistor T4 into the base of transistor T3, turning transistor T3 on.

A problem occurs when a low signal present on the data line is to be written into the memory cell. In response to a "low" signal present on the data line, transistor T1 is supposed to cut off and $\overline{Q}$ is to be set to its low state. i.e. heavy conduction. To turn off transistor T1, the signal applied to its base must be less than the $V_{BE}$ (approximately 0.7 volt) of the transistor T1. But, the low signal on the data line is produced by the turn-on of transistor T5. Since transistor T5 is a Schottky clamped transistor, its $V_{cemin}$ may be as high as 0.4 volt. When transistor T3 is turned on, its $V_{cemin}$ may also be as high as 0.4 volt. The collector-to-emitter paths of transistors T3 and T5 are, effectively, connected in series between the base of transistor T1 and ground potential. To turn off transistor T1, the sum of the $V_{cemin}$ of transistors T3 and T5 must be lower than the $V_{BE}$ (0.7 volt) of transistor T1, but in fact may be higher (0.8 volt). Therefore, it is evident that transistor T1 cannot be reliably turned off by this method.

A second problem exists in the circuit of FIG. 2 with the circuitry for selecting the memory cell. Assume: (1) Schottky clamped transistors T7 and T9, because of their higher operating speeds, are used to apply the low signals to the input leads 12 and 14. The low level signal applied to terminals 12 and 14 is 0.4 volt and no information is to be written into the bistable circuit; (2) the $V_{cemin}$ of transistor T4 is 0.4 volt; and (3) the low level applied to the data line is 0.2 volt. Accordingly, with transistor T4 conducting and either transistor T7 or T9 conducting, the base of transistor T3 is at 0.8 volt and its emitter is at 0.2 volt. As a result, any negative going noise pulse on the data line or any positive noise pulse coupled to the base of transistor T3 having an amplitude as low as 0.1 volt causes transistor T3 to conduct, resulting in the writing of possibly incorrect information into the memory cell. A memory cell having such a low noise margin cannot be reliably operated. In addition, since the $V_{BE}$ of a transistor decreases by 2 millivolts per degree centigrade at elevated temperatures transistor T3 may be turned on even though signals A and B are both low. It is elementary that in addition to speed, a memory cell must operate reliably in a noisy environment and over a reasonably wide temperature range.

Memory cells embodying the invention are adapted for use in a memory array in which the data lines and the cell select lines are clamped by non-saturating transistors to first and second voltage levels producing the "high" and low binary condition. The memory cell includes a bistable circuit comprising two cross-coupled transistors and a third transistor having its collector-to-emitter path connected between the base of one of said two cross-coupled transistors and a data line. The emitters of the cross-coupled transistors are connected in common and a resistor, which may be a diffused tunnel region, is connected between the emitters and one of said first and second voltage levels. Preferably, the value of the resistor is such that the voltage drop across the resistor plus the base-to-emitter voltage of either one of said two cross-coupled transistors is greater than the minimum collector-to-emitter voltage of two series connected non-saturating transistors.

In response to a cell select signal, the information on the data line is written into the bistable circuit by turning on the third transistor by means of a forward biasing current coupled to the third transistor through a diode.

In response to the absence of a cell select signal, the third transistor is kept in the off condition by means of a clamping diode inhibiting the passage of a forward biasing current to said third transistor.

Figure 3:
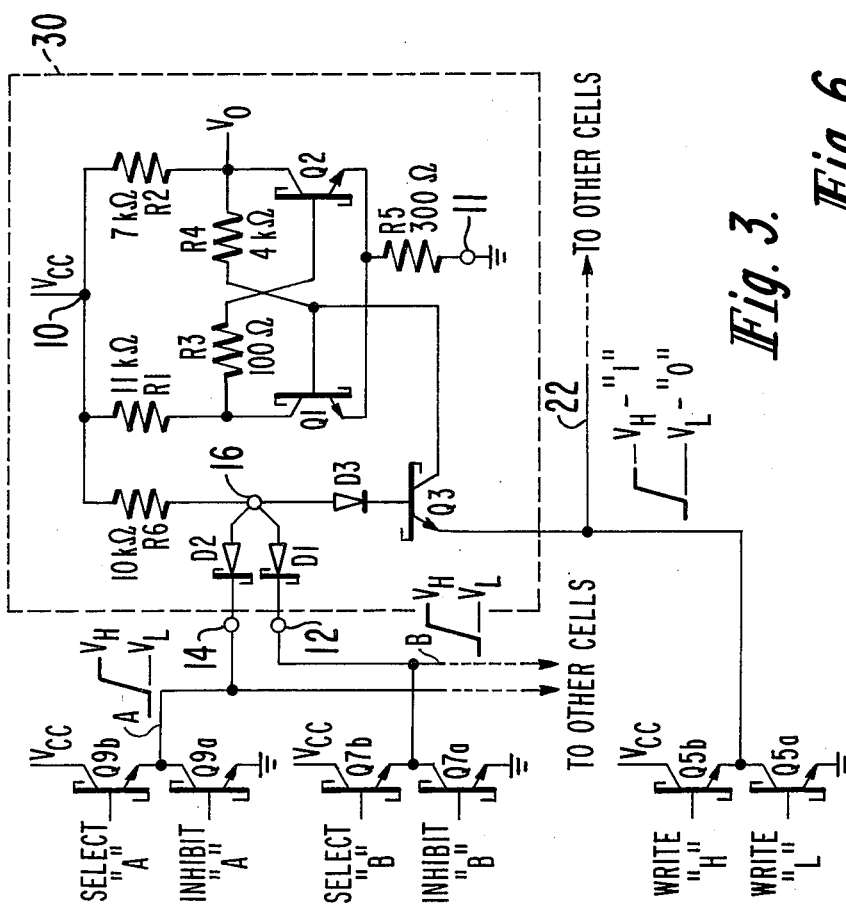
FIG. 3 is a schematic diagram of a circuit embodying the invention.

The memory cell 30 circuit of FIG. 3 includes SBD clamped transistors Q1 and Q2 cross-coupled to form a bistable flip-flop. The base of transistor Q1 is connected by means of resistor R4 to the collector of transistor Q2 and the base of transistor Q2 is connected by means of resistor R3 to the collector of transistor Q1. The collectors of transistors Q1 and Q2 are connected by means of resistors R1 and R2, respectively, to terminal 10. The emitters of transistors Q1 and Q2 are connected in common at one end of common emitter resistor R5. The other end of resistor R5 is connected to terminal 11. A source of operating potential is connected between terminals 10 and 11 with the most positive potential denoted $V_{cc}$ applied to terminal 10 and the most negative potential, denoted by ground, applied to terminal 11.

The collector-to-emitter path of transistor Q3 is connected between data line 22 and the base of transistor Q1. Current is supplied to the base of transistor Q3 by means of resistor R6 connected between terminals 10 and 16. The anode of diode D3, which is shown as a conventional PN junction diode but which could also be any other suitable unidirectional conducting device, is connected to terminal 16 and its cathode is connected to the base of transistor Q3. Schottky diodes D1 and D2 are connected at their anodes to terminal 16 and at their cathodes to terminals 12 and 14. respectively, to which are applied address signals labelled "B" and "A", respectively.

Data signals are provided on data line 22 by means of Schottky clamped transistors Q5a, Q5b and address signals B and A are produced at terminals 12 and 14 by means of Schottky clamped transistors Q7a, Q7b, Q9a and Q9b. Transistors Q5a, Q7a and Q9a have their collector-to-emitter paths connected between ground potential and data line 22, terminal 12 and terminal 14, respectively. Transistors Q5b, Q7b and Q9b have their collector-to-emitter paths connected between terminal 10 and data line 22, terminal 12 and terminal 14, respectively. A positive (turn on) signal applied to the bases of transistors Q5b, Q7b and Q9b causes the potential at their emitters to rise to approximately ($V_{cc} - V_{BE}$) volts, which is referred to herein as the high or "hi" voltage condition and is arbitrarily defined as the binary one ("1") condition. A positive (turn on) signal applied to the bases of transistors Q5a, Q7a and Q9a causes the potential at their collectors to be clamped to within $V_{cemin}$ volts of ground potential. As discussed above the $V_{cemin}$ of a Schottky clamped transistor varies between 0.2 volt and 0.4 volt. In the discussion to follow $V_{cemin}$ will sometimes be referred to as $V_L$: the high $V_{cemin}$ level of 0.4 volt as $V_{LH}$ and the low $V_{cemin}$ level of 0.2 volt as $V_{LL}$. The $V_{cemin}$ level is referred to herein as the low or "lo" voltage condition and is arbitrarily defined as the binary zero ("0") condition.

The information present on data line 22 is written (transferred) into the bistable circuit only when both of the address signals A and B are high. When A=B=Hi, diodes D1 and D2 are reverse biased. A current, which may be defined as the write current, then flows from terminal 10 through resistor R6 and through diode D3 into the base of transistor Q3 in a direction to forward bias the transistor.

If the signal applied to data line 22 is high, when A=B=Hi, transistor Q3 is reverse biased and the forward bias write current flows from terminal 10 through resistor R6, diode D3, the base-to-collector Schottky clamp diode of transistor Q3 into the base of transistor Q1. This current in sufficient to turn on transistor Q1 under all circumstances. (Note that the two cases when the data to be written into the bistable circuit has the same logic level as the data being stored never present a problem and require no explanation). If the signal applied to data line 22 is low, when A=B=Hi, the write current flows through the base-to-emitter region of transistor Q3. Transistor Q3 then conducts current from the base of transistor Q1 along its collector-to-emitter path into data line 22. For this condition, it may be assumed, for case of explanation, that transistor Q3 clamps the base of transistor Q1 to $V_{cemin}$ volts above the data line potential.

The operation of the bistable circuit and how information is written into the bistable circuit is best explained as follows. Assume, for example, that $V_{cc}$ is approximately 5.5 volts and that resistors R1, R2, R3, R4 and R5 are, respectively, 11K ohms, 7K ohms, 100 ohms, 4K ohms and 300 ohms as indicated in FIG. 3. For these potential and ohmic values, a current of approximately one milliampere (1 mA) flows quiescently through resistor R5 whether transistor Q1 or Q2 is conducting. Accordingly, the potential at the common emitters of transistor Q1 and Q2 is approximately 0.3 volt.

When transistor Q1 is conducting, transistor Q2 is cut off. The potential at the collector of transistor Q1 may be assumed to be approximately 0.7 volt due to the 0.3 volt drop across resistor R5 and the 0.4 volt drop across the collector-to-emitter of transistor Q1. A collector current of approximately 0.5 mA flows from terminal 10 through the collector-to-emitter path of transistor Q1 and into resistor R5. In addition, a current of approximately 0.5 mA flows from terminal 10 through resistors R2 and R4 and through the base-emitter region of transistor Q1 into resistor R5. The potential at the collector of transistor Q2, which is defined as the output $V_o$, is at approximately 2.5 volts, which is the high output condition of the cell.

When transistor Q1 is cut off, transistor Q2 is conducting and $V_o$ may now be assumed to be approximately equal to 0.7 volts, which is the low output condition. A forward biasing current flows from terminal 10 through resistors R1 and R3 into the base of transistor Q2 and thence into resistor R5. In addition, a collector current flows from terminal 10 through resistor R2 and through the collector-to-emitter path of transistor Q2 into resistor R5.

Due to the voltage drop across resistor R5, the potential at the base of transistors Q2 or Q1 (when unclamped by transistor Q3, that is when Q3 is cut off) is raised to approximately 1.0 volt. The 1.0 volt level is the sum of the offset voltage of 0.3 volt developed across R5 and the $V_{BE}$ drop of either transistors Q1 or Q2. As a result transistor Q1 is cut off when its base potential is lowered below 1.0 volt.

Assume that a write cycle is initiated (A=B=Hi) when transistor Q1 is conducting ($V_o$ is in its high state). Assume further that a low level of value $V_{LH}$ (which represents the worst case) is present on data line 22. When transistor Q3 is turned on, its $V_{cemin}$ is at most equal to 0.4 volt, and even if a $V_{LH}$ of 0.4 volt is applied to the data line, the base of transistor Q1 is clamped to 0.8 volt. Transistor Q1 stops conducting since its base is lowered to approximately 0.8 volt while its emitter is at approximately 0.3 volt. The 0.5 volt across the base-to-emitter of the transistor is insufficient to maintain conduction on transistor Q1. In addition to lowering the base potential of transistor Q1, transistor Q3 also shunts current from the base of transistor Q1, hastening its cut off. Also, as transistor Q1 stops conducting the potential at its collector rises, causing the turn-on of transistor Q2. This further lowers the base potential of transistor Q1 and further accelerates the turn-off of transistor Q1. It has thus been shown that the sum of the $V_{cemin}$ of transistors Q3 and Q5a is less than the unclamped potential at the base of transistor Q1. Thus, when transistor Q1 is conducting, its state and that of the bistable circuit may be changed without problem.

Thus, in circuits embodying the invention, the state of transistor Q1 my be changed, reliably, regardless of the state of the bistable circuit or whether a high or a low input is to be written into the cell.

It should be appreciated that resistor R5 is used to produce an offset voltage which, when summed with the $V_{BE}$ of transistor Q1, provides a base potential level which is greater than the sum of the $V_{cemin}$ of two conducting non-saturating (Schottky-clamped) transistors.

It should also be noted that the offset voltage produced across resistor R5 must not be too great. Otherwise, the low level of $V_o$ will be higher and may not be compatible with other circuits in the same logic family. For example in the present system the low level of $V_o$ cannot be greater than 0.8 volt (2 × $V_{cemin}$). Accordingly, the offset voltage in the emitter circuit of transistor Q1 and Q2 should be such that: (1) the potential at the base of transistors Q1 or Q2 is greater than two $V_{cemin}$; and (2) the potential at the collector of transistors Q2 is less than 0.8 volt (2 × $V_{cemin}$). That is, Voffset +$V_{BE}$ should be greater than 2 × $V_{cemin}$ while Voffset +$V_{cemin}$ should be less than 2 × $V_{cemin}$; where Voffset is the voltage drop cross resistor R5.

Figure 4:
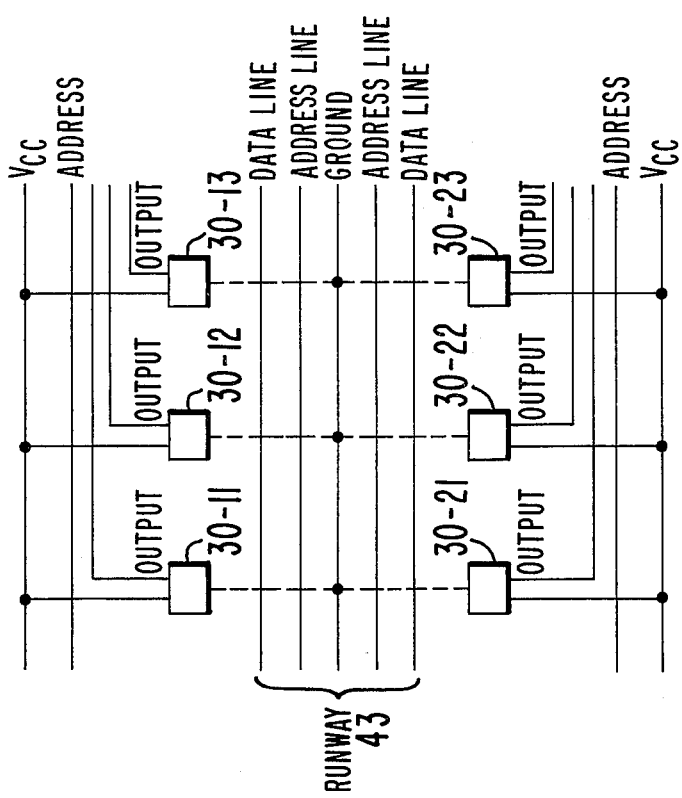
FIG. 4 is a block diagram of a memory array employing memory cells embodying the invention.
Figure 6:
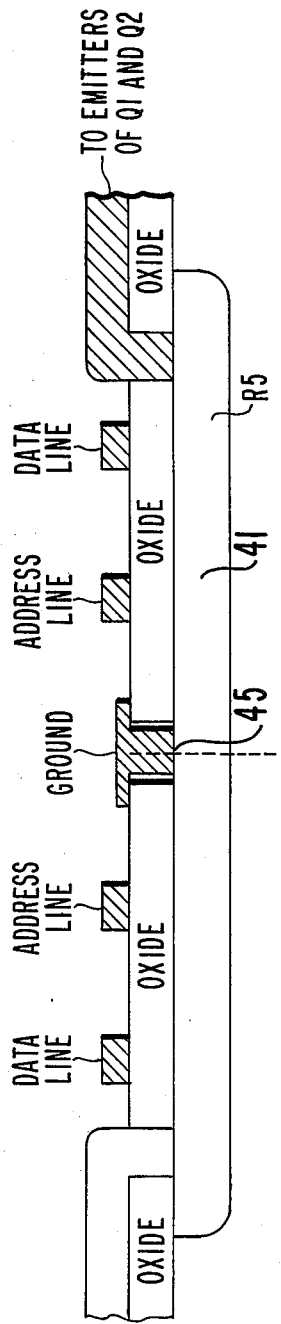
FIG. 6 is a sectional view of a portion of a memory cell taken along line 6—6 of FIG. 5.
Figure 5:
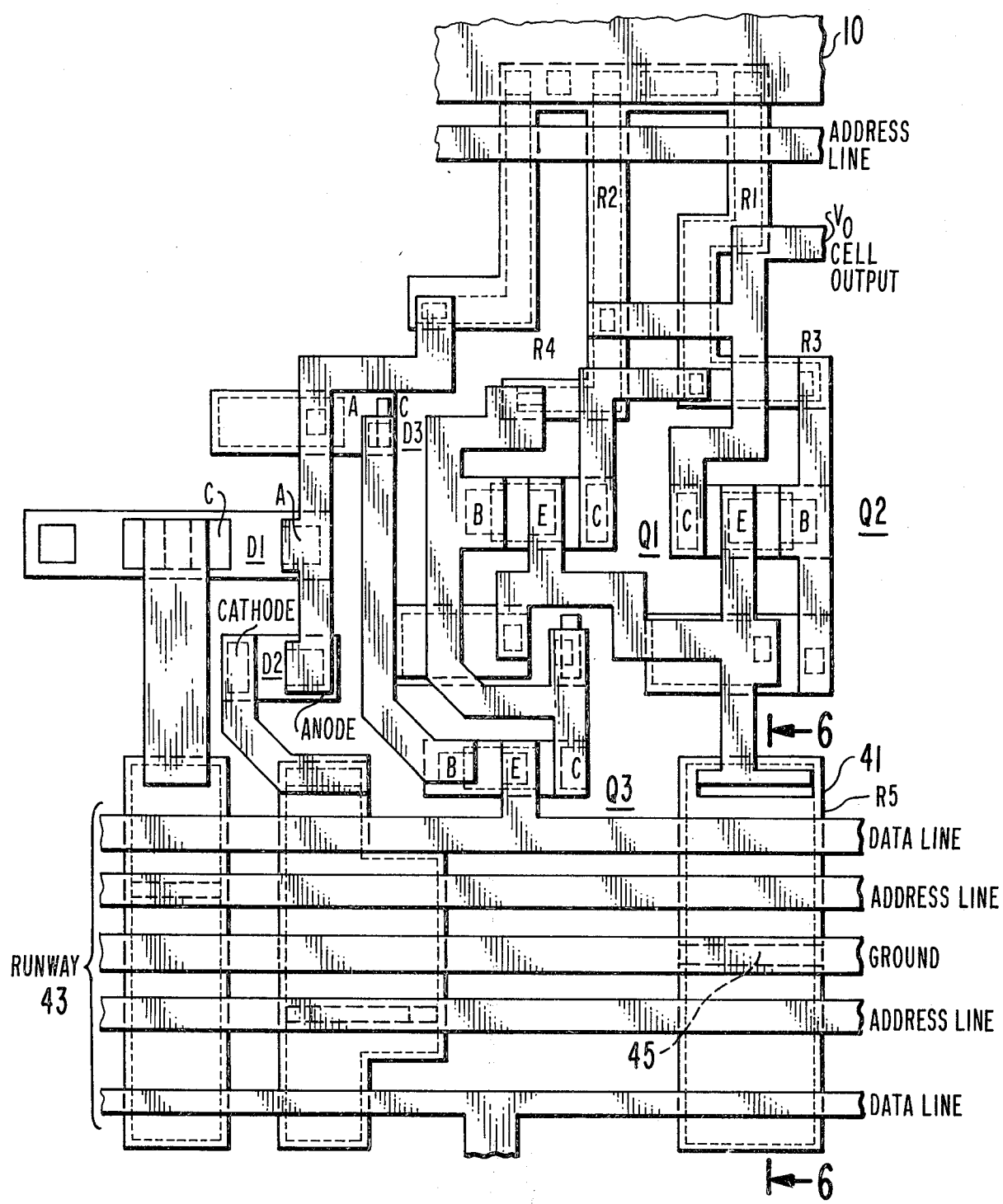
FIG. 5 is a top view of the layout of a memory cell embodying the invention.

FIG. 4 illustrates how the memory cells are organized in rows and columns with runways between adjacent rows of cells. Each of the cells is denoted by the numeral 30 followed by a two number reference character designating the row and column location respectively. Supply, address, data and output lines are routed along each runway. A technique of coupling the memory cells to the supply lines with a minimum number of crossovers is illustrated in FIGS. 5 and 6. In particular, resistor R5 may be a tunnel region which couples a cell to the ground line.

Resistor R5 may be formed as shown in FIGS. 5 and 6. In FIG. 5 the metal interconnections are shown shaded and the diffused regions are shown with dotted lines. As shown in FIG. 5, the emitters (E) of transistors Q1 and Q2 are connected to one end of a diffused region 41, part of which forms resistor R5. The diffused region, also called a tunnel, passes underneath a runway 43 along which are routed two address lines, a data line and a ground line. An access hole 45 through the ground line enables connection of the ground line to the diffused region. That portion of the diffused region between the emitters of transistors Q1 and Q2 and access hole 45 is resistor R5 and is designed to have an impedance to provide the required offset voltage.

It should be appreciated that, normally, connections to the ground line are required to be made by a low impedance path. This would require that there be one ground line per row. The use of a diffused region to interconnect the memory cell to the ground line permits two adjacent rows on either side of a runway to share the same ground line. The diffused region 41 thus serves the dual function of coupling the emitters to ground while providing the correct offset voltage. This saves valuable space. Also it minimizes the need for metal crossovers while providing the necessary impedance for reliable operation of the memory cell.

Returning to the circuit of FIG. 3, it should be recalled that transistor Q3 is cut off when the signals applied to either one or both of terminals 12 are low. It is critical that when either one or both of the signals A and B are low (cell not selected) that no information be written into the cell and that no disturb current be supplied to and through transistor Q3 to the bistable circuit. The circuit as discussed below meets this condition.

When either one or both of the signals A and B applied to the cathodes of diodes D1 and D2 are low, the potential at junction 16 is clamped to one diode drop above the low potential at terminals 12 or 14. Current flows from $V_{cc}$ through resistor R6 and through either one or both of diodes D1 and D2 into terminal 12 and/or 14. The low potential at terminals 12 or 14 is equal to the $V_{cemin}$ of a Schottky clamped transistor Q7a or Q9a. The maximum value of $V_{LH}$ is 0.4 volt and the maximum $V_F$ of the Schottky diode is 0.5 volt. Thus, when either one of signals A and B is low the maximum potential at mode 16 is 0.9 volt. For this condition it can be demonstrated that for all possible signal conditions on the data line (1 or 0) and over a wide temperature range transistor Q3 remains cut off and no disturb current can flow into the flip-flop.

Figure 1A:
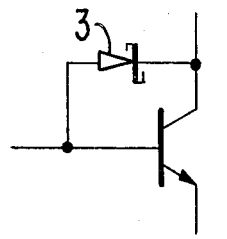
FIG. 1A is a schematic diagram of an NPN bipolar transistor having a Schottky barrier diode connected between its base and collector.
Figure 1B:
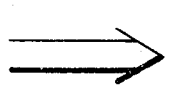
FIG. 1B is a symbolic representation of the Schottky clamped transistor of FIG. 1A.
Figure 1B:
Figure 2:
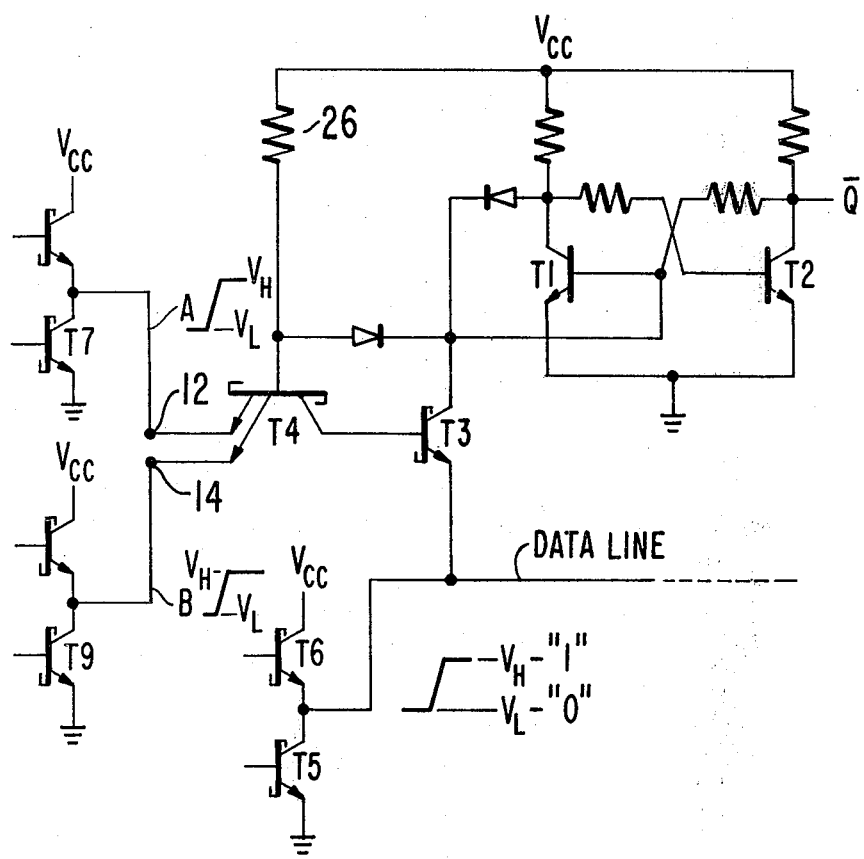
FIG. 2 is a schematic diagram of a circuit presented to illustrate various problems associated with the use of non-saturating transistors.

The $V_F$ of diode D3 may be assumed to be 0.7 volt. Diode D3 functions to offset the potential drop across diodes D1 or D2 by producing a voltage drop between junction 16 and the base of transistor Q3 which is at least equal to but preferably greater than the drop across diodes D1 or D2. When the potential at node 16 is 0.9 volt the potential at the base of transistor Q3 is 0.2 volt. Whether $V_{LL}$ or $V_{LH}$ is present on the data line transistor Q3 is cut off since its base is at most at 0.2 volt and its emitter is at least at 0.2 volt. This is in sharp contrast to the circuit of FIG. 2 where for $V_{LL}$ on the data line information may be written into the cell.

Since the diode D3 drop varies in the same direction with temperature as diodes D1 and D2 their temperature variations are nearly cancelled out. Therefore, the noise immunity is equal to the $V_{BE}$ of transistor Q3 throughout the temperture range.

The transistors have been shown to be Schottky clamped transistors, but it should be appreciated that any non-saturating transistors could likewise be used. Also, it should be appreciated that with due regard for polarity PNP transistors could be used instead of NPN transistors.

What is claimed is:

1. In combination with a bistable circuit comprising first and second cross-coupled transistors having their collectors connected to a first point of operating potential and having their emitters connected in common to a first node, where the bistable circuit is set to one of two binary conditions by the turn on of two non-saturating transistors having their collector-to-emitter paths connected in series between the base of one of said two cross-coupled transistors and a second point of operating potential, said two non-saturating transistors, when turned on, clamping the potential between the base of said one cross-coupled transistor and said second point to $V_S$ volts, where $V_S$ is the sum of the minimum collector-to-emitter voltage drops of said two non-saturating transistors, the improvement comprising:

a resistor, connected between a point common to the emitters of said two cross-coupled transistors and said second point of potential for carrying the current that flows through the two cross-coupled transistors and developing a voltage drop ($V_R$) across said resistor, whereby the minimum potential that must be applied between the base of said one transistor and said second point to turn on or maintain conduction of said one transistor must equal, or exceed, $V_R$ plus the base-to-emitter voltage drop ($V_{BE}$) of said one of said two cross-coupled transistors; and wherein the minimum value of said resistor is such that the sum of $V_R$ and $V_{BE}$ is greater than $V_S$, and the maximum value of said resistor is such that $V_R$ plus the minimum collector-to-emitter voltage drop of either one of said two cross-coupled transistors is equal to, or less than, $V_S$.

2. An array of memory cells sharing a common semiconductor substrate, the cells being arranged in rows and columns with a runway positioned between adjacent rows, each runway for the routing therealong of at least one of two lines across which are applied the operating potential for a row of cells, each cell including two cross-coupled transistors having their emitters connected in common to a node, means for setting each cell to one of two binary conditions including two non-saturating transistors having their collector-to-emitter paths connected in series between the base of one of said two cross-coupled transistors and a point whose potential is equal to that on said one of said two lines, the improvement comprising:

a diffused region connected between said node and siad one of two lines; said diffused region providing a resistive path for conducting the current flowing through said cross-coupled transistors and producing a voltage offset raising the potential at the emitters and bases of said cross-coupled transistors, the minimum value of said resistive path being such that the voltage drop across said resistive path plus the base-to-emitter voltage drop of either one of said two cross-coupled transistors is greater than $V_S$, where $V_S$ is equal to the sum of the minimum collector-to-emitter voltage drops of said two series connected non-saturating transistors and the maximum value of said resistive path being such that the voltage drop across said resistive path plus the minimum collector-to-emitter voltage of either one of said two cross-coupled transistors in equal to or less than $V_S$.

3. In a memory array in which one of two binary conditions is written on a data line by turning on a non-saturating write transistor having its collector-to-emitter path connected between said data line and a reference point, a memory cell comprising:

a data input, connected to said data line, for the application thereto of binary data to be written into said memory cell; and at least one cell select terminal for the application thereto of a cell select signal for enabling the writing of data into said cell;

means for the application of an operating potential between a first point and said reference point;

first, second and third transistors, each transistor having emitter and collector electrodes defining the ends of a conduction path and a base electrode;

means connecting the base electrode of the first transistor to the collector electrode of the second transistor and means connecting the base electrode of the second transistor to the collector electrode of the first transistor;

means connecting the collector electrodes of said first and second transistors to said first point;

means connecting the emitter electrodes of the first and second transistors in common to a first node;

means connecting the collector-to-emitter path of said third transistor between the base electrode of said first transistor and said data input;

a resistor connected between said first node and said reference point, for carrying the current that flows through said first and second transistors and developing a voltage drop ($V_R$) across said resistor, whereby the minimum potential differential that must be applied between the base of said first transistor and said reference point to turn it on or maintain it in conduction must equal, or exceed, $V_R$ plus the base-to-emitter voltage drop ($V_{BE}$) of said first transistor, and wherein the minimum value of said resistor is such that the sum of $V_R$ and $V_{BE}$ is greater than $V_S$, where $V_S$ is defined as the sum of the minimum collector-to-emitter voltages of said third transistor and said non-saturating transistor; and said resistor having a maximum value such that $V_R$ plus the minimum collector-to-emitter voltage drop of either one of said first and second transistors is equal to, or less than, $V_S$;

a first diode connected between a second node and the base electrode of said third transistor;

a current path connected to said second node for passing a current through said first diode having a polarlity to forward bias said third transistor; and a second diode connected between said second node and said at least one cell select terminal for clamping said second node to said select terminal in the absence of a cell select signal and inhibiting the passage of said current through said first diode and thereby maintaining said third transistor in the off condition; and said second diode being reverse biased when a cell select signal is applied to said select terminal.

4. The memory cell as claimed in claim 3 wherein said means for passing said current includes a second resistor connected between said first point of potential and said second node.

5. The memory cell as claimed in claim 4 wherein each one of said first, second and third transistors has a diode connected between its base and its collector poled in a direction to prevent the saturation of the transistor.

6. The memory cell as claimed in claim 5 wherein said base-to-collector diode is a Schottky barrier diode; wherein said second diode is a Schottky diode; and wherein said first diode is a PN junction diode.

7. In the array as claimed in claim 6 further including an additional write transistor having its collector-to-emitter path connected between said data input and said first point for applying the other binary condition to said data input; and wherein said non-saturating write transistor has a Schottky diode connected between its base and collector.

8. The memory cell as claimed in claim 7 wherein the signal applied to said at least one cell select terminal is produced by a sixth transistor having its collector-to-emitter path connected between said terminal and said second point and a seventh transistor having its collector-to-emitter path connected between said terminal and said first point and wherein said sixth transistor has a Schottky diode connected between its base and collector.

* * * * *